(12) United States Patent
Yamamoto

(10) Patent No.: US 7,880,262 B2
(45) Date of Patent: Feb. 1, 2011

(54) SEMICONDUCTOR DEVICE

(75) Inventor: Fumitoshi Yamamoto, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 179 days.

(21) Appl. No.: 12/360,357

(22) Filed: Jan. 27, 2009

(65) Prior Publication Data
US 2009/0189247 A1  Jul. 30, 2009

(30) Foreign Application Priority Data
Jan. 28, 2008  (JP) ............................. 2008-016656

(51) Int. Cl.
*H01L 21/70* (2006.01)
(52) U.S. Cl. .................. 257/501; 257/E21.544; 257/544; 257/509
(58) Field of Classification Search .......... 257/E21.544, 257/544–556, 500, 501, 509
See application file for complete search history.

(56) References Cited

U.S. PATENT DOCUMENTS 5,493,133 A * 2/1996 Duvvury et al. ............. 257/111

2004/0232522 A1 * 11/2004 Shimizu ...................... 257/548

OTHER PUBLICATIONS

Stella, R., et al., "Novel achievements in the understanding and suppression of parasitic minority carrier currents in $P^-$ epitaxy/$P^{++}$ Substrate Smart Power Technologies", Proceedings of 2004 International Symposium on Power Semiconductor Devices & ICs, Kitakyushu, pp. 423-426.

* cited by examiner

*Primary Examiner*—Davienne Monbleau
*Assistant Examiner*—Matthew Reames
(74) *Attorney, Agent, or Firm*—McDermott Will & Emery LLP

(57) ABSTRACT

An active barrier structure has a p-type region and an n-type region, each of which is in contact with a p-type impurity region and which are ohmic-connected to each other to attain a floating potential. A trench isolation structure is formed between an active barrier region and the other region (an output transistor formation region and a control circuit formation region). The trench isolation structure has a trench extending from the main surface of the semiconductor substrate through the $n^-$ epitaxial layer to reach the p-type impurity region. Therefore, a semiconductor device is obtained which allows the chip size to be reduced easily and is highly effective in preventing movement of electrons from the output transistor formation region to the other element formation region.

4 Claims, 20 Drawing Sheets

SEMICONDUCTOR DEVICE

BACKGROUND OF THE INVENTION

1. Field of the Invention

The present invention relates to a semiconductor device, and more particularly to a semiconductor device having an output element formation region, an other element formation region, and an active barrier region arranged between the output element formation region and the other element formation region.

2. Description of the Background Art

In products used for automobiles, motor drive, audio amplifiers, and the like, an L (self inductance) load sometimes produces counter-electromotive force to cause the drain (n-type region) of an output transistor to have a negative potential. In this case, the negative potential allows electrons to be injected from the drain to a p-type substrate and move from an output transistor formation region to an other element formation region through the p-type substrate, causing the other elements to malfunction. To solve this problem, an active barrier region may be formed between the output transistor formation region and the other element formation region.

This active barrier region is formed such that a p-type region and an n-type region having a floating potential are ohmic-connected through a conductive layer, as disclosed in the following document: A. R. Stella, et al., "Novel achievements in the understanding and suppression of parasitic minority carrier currents in $P^-$ epitaxy/$P^{++}$ Substrate Smart Power Technologies," Proceedings of 2004 International Symposium on Power Semiconductor Devices & ICs, Kitakyushu, pp. 423-426.

More specifically, electrons injected into a p-type substrate disappear in the p-type substrate due to recombination or are taken into the n-type region of the active barrier region. Since electrons are taken into the n-type region of the active barrier region, the n-type region attains a positive potential. When the n-type region attains a positive potential, the p-type region of the active barrier region attains a negative potential in order to cancel this, because the p-type region and the n-type region having a floating potential are ohmic-connected through the conductive layer in the active barrier region. When the p-type region of the active barrier region attains a negative potential, the electrons injected into the p-type substrate hardly move forward from the p-type region having a negative potential. Therefore, electrons hardly reach the other element formation region from the active barrier region, preventing a malfunction of the other elements.

However, in conventional semiconductor devices, the active barrier region and the output transistor formation region as well as the active barrier region and the other element formation region are electrically isolated from each other by a pn junction. In the isolation structure using this pn junction, impurity diffusion in the impurity diffusion region forming the isolation structure inevitably increases the size of the isolation structure, so that the chip size cannot be decreased.

In addition, in the isolation structure using a pn junction, the effect of preventing the movement of electrons from the output transistor formation region to the other element formation region is not enough.

SUMMARY OF THE INVENTION

The present invention is made in view of the aforementioned problem, and the object of the present invention is to provide a semiconductor device which allows the chip size to be reduced easily and is highly effective in preventing movement of electrons from an output transistor formation region to an other element formation region.

A semiconductor device in the present embodiment has an output element formation region, an other element formation region, and an active barrier region arranged between the output element formation region and the other element formation region. The semiconductor device includes a semiconductor substrate, a first region of a first conductivity type, a second region of a second conductivity type, an active barrier structure, and a trench isolation structure. The semiconductor substrate has a main surface. The first region of the first conductivity type is formed in the semiconductor substrate in the output element formation region, the other element formation region, and the active barrier region. The second region of the second conductivity type is formed in the semiconductor substrate in the output element formation region, the other element formation region, and the active barrier region so as to form a pn junction with the first region and to be positioned on the main surface side of the semiconductor substrate rather than the first region. The active barrier structure has a third region of the first conductivity type and a fourth region of the second conductivity type, each of which is in contact with the first region and which are ohmic-connected to each other to attain a floating potential, in the active barrier region. The trench isolation structure has a trench formed at least either between the active barrier region and the output element formation region or between the active barrier region and the other element formation region and formed to extend from the main surface of the semiconductor substrate through the second region and then reach the first region.

In accordance with the semiconductor device in the present embodiment, a trench isolation structure is formed at least either between the active barrier region and the output element formation region or between the active barrier region and the other element formation region. Because of isolation by a trench in this manner, the two-dimensional area occupied by the isolation structure can be made smaller than the isolation using a pn junction. Therefore, the chip size can easily be reduced.

Furthermore, the trench is formed to extend from the main surface of the semiconductor substrate through the second region to reach the first region. Thus, carriers based on counter-electromotive force injected from the output element cannot reach the other element formation region without bypassing the trench. Accordingly, the movement path of carriers from the output element formation region to the other element formation region becomes longer, thereby increasing the possibility that the carriers disappear in the course due to recombination. Therefore, the movement of carriers based on counter-electromotive force from the output element formation region to the other element formation region can be inhibited, thereby preventing a malfunction of the other elements.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the embodiments of the present invention will be described based on the figures.

First Embodiment

Figure 1:
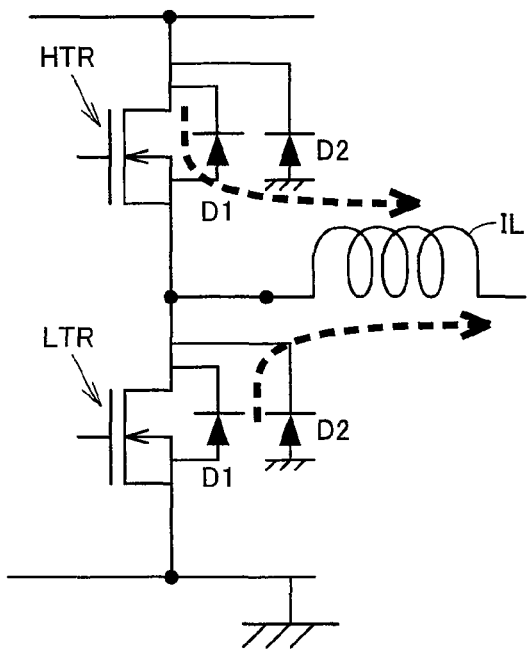
FIG. 1 is a circuit diagram showing that an output element is connected to an inductive load in a semiconductor device in a first embodiment of the present invention.

Referring to FIG. 1, an output element formed in a semiconductor chip includes, for example, a high-voltage High side n-channel MOS (Metal Oxide Semiconductor) transistor (referred to as an nMOS transistor hereinafter) HTR and a high-voltage Low side nMOS transistor LTR.

A diode D1 is formed between the back gate and the drain of each of nMOS transistor HTR and nMOS transistor LTR. In addition, a diode D2 is formed between a p-type semiconductor substrate and the drain of each of nMOS transistor HTR and nMOS transistor LTR.

The source of nMOS transistor HTR and the drain of nMOS transistor LTR are electrically connected to each other and are electrically connected to an inductive load (for example, a coil) IL arranged on the outside of the semiconductor chip.

It is noted that an output element refers to an element electrically connected to an electronic device arranged on the outside of a semiconductor chip.

Figure 2:
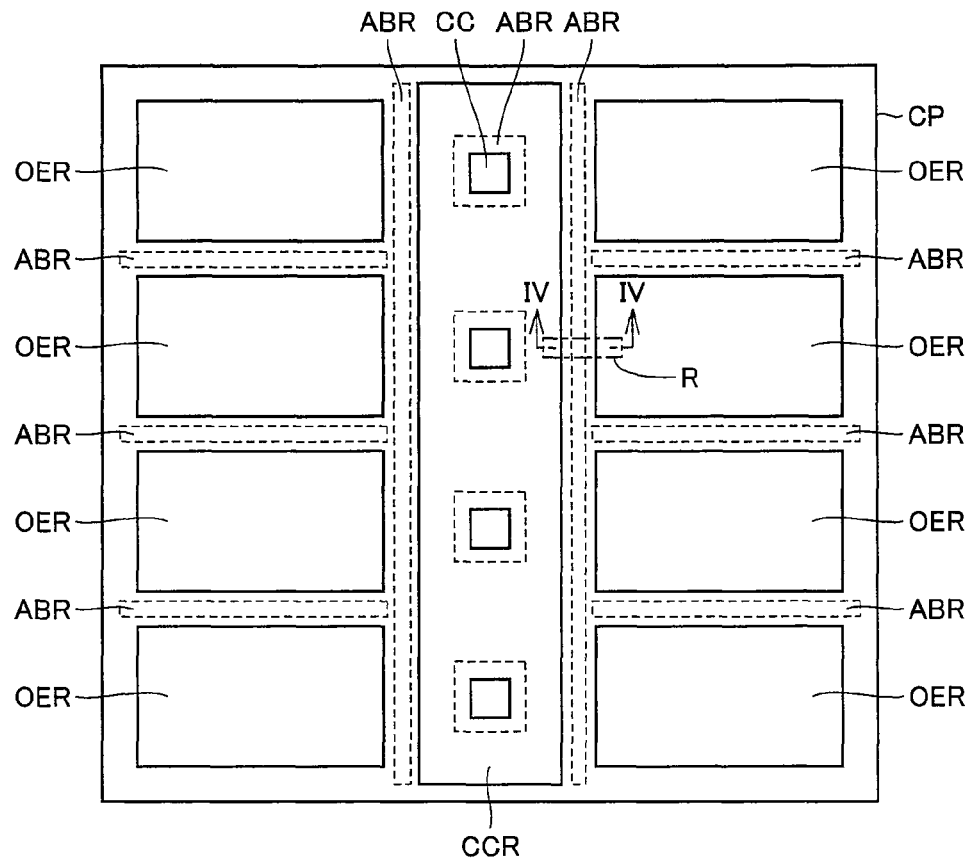
FIG. 2 is a plan view schematically showing a configuration of the semiconductor device in the first embodiment of the present invention having the output element shown in FIG. 1.

Referring to FIG. 2, a semiconductor chip CP has, for example, a rectangular shape as two-dimensionally viewed. This semiconductor chip CP has a plurality of output transistor formation regions CCR, a control circuit formation region CCR, and a plurality of active barrier regions ABR.

Output transistor formation region OER has an output element shown in FIG. 1. Control circuit formation region CCR has other elements for controlling the output element formed in output transistor formation region OER.

Active barrier region ABR is formed between output transistor formation region OER and control circuit formation region CCR and between output transistor formation region OER and output transistor formation region OER.

Furthermore, active barrier region ABR may be formed in control circuit formation region CCR so as to surround the periphery of a particular circuit CC in control circuit formation region CCR. This particular circuit CC surrounded by active barrier region ABR is, for example, an analog detection circuit (comparator, detector circuit), a sample-and-hold circuit, a voltage/current control circuit for an output transistor, a bandgap circuit, a DC-DC converter circuit, an oscillator, a phase locked loop (PLL) circuit, a charge pump circuit, or the like.

Figure 3:
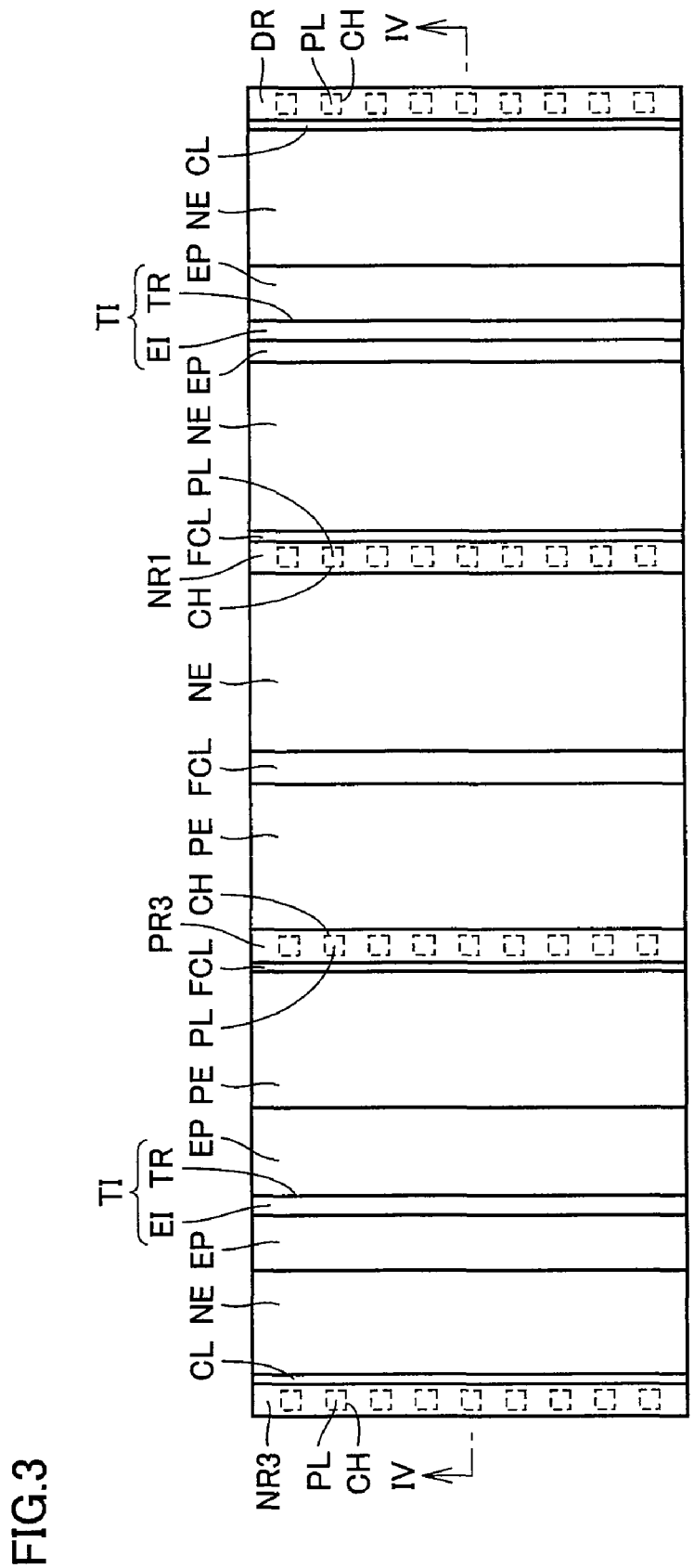
FIG. 3 is a schematic plan view showing an enlarged view of a region R in FIG. 2.
Figure 4:
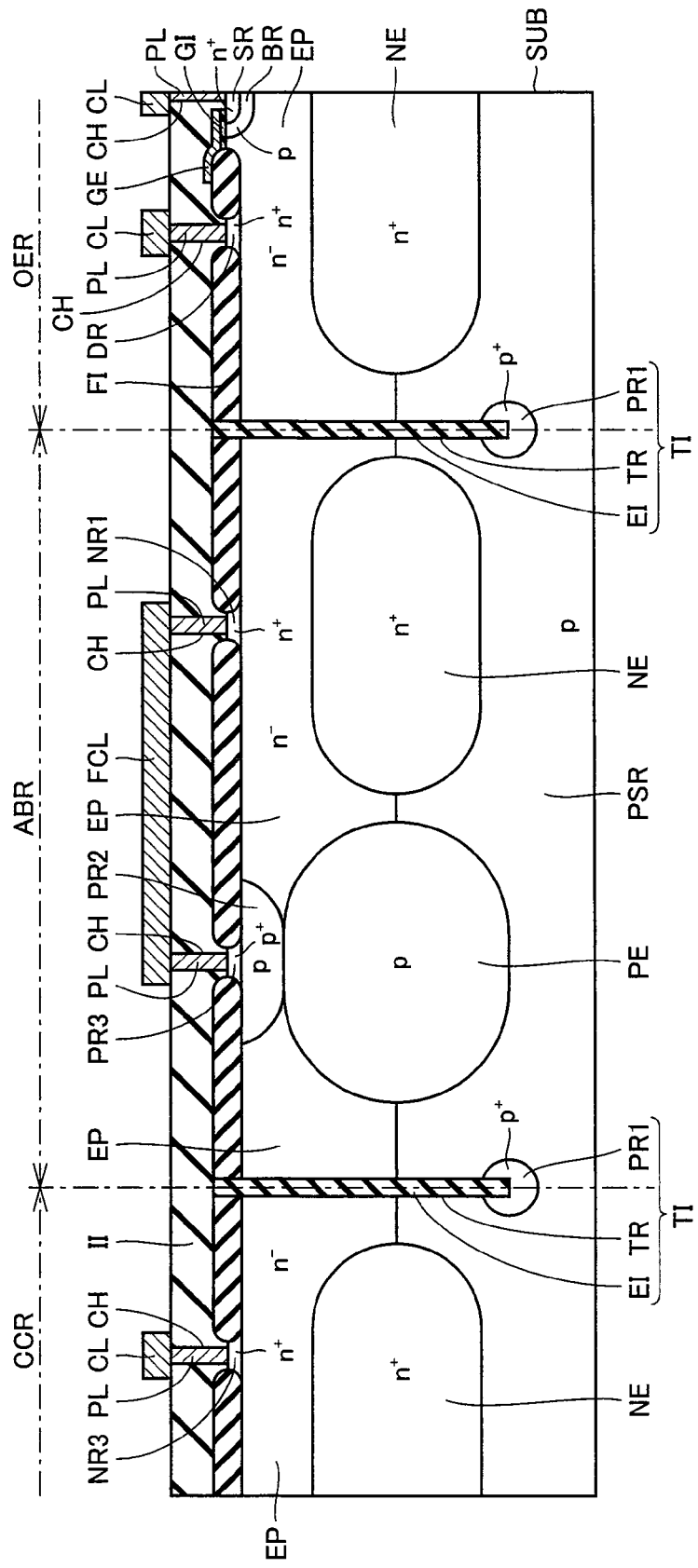
FIG. 4 is a schematic cross-sectional view taken along line IV-IV in FIG. 3.

Referring to FIG. 3 and FIG. 4, a semiconductor substrate SUB is formed of, for example, a p-type silicon substrate. In output transistor formation region OER, control circuit formation region CCR, and active barrier region ABR, a p-type impurity region (first region) PSR is formed in semiconductor substrate SUB.

An n-type epitaxial layer (second region) EP is formed so as to form a pn junction with p-type impurity region PSR and to be located on the main surface side of semiconductor substrate SUB rather than p-type impurity region PSR. This n-type epitaxial layer EP is formed in semiconductor substrate SUB, in output transistor formation region OER, control circuit formation region CCR, and active barrier region ABR. N-type epitaxial layer EP has a concentration of, for example, $2.6 \times 10^{15}$ cm$^{-3}$ to $3.4 \times 10^{13}$ cm$^{-3}$.

A field insulating layer FI formed of, for example, a LOCOS (Local Oxidation of Silicon) oxide film is selectively formed on the main surface of semiconductor substrate SUB.

In output transistor formation region OER, a buried n$^+$ diffusion region NE is formed between p-type impurity region PSR and n-type epitaxial layer EP. In addition, in output transistor formation region OER, for example, high-voltage nMOS transistors HTR, LTR shown in FIG. 1 and the like are formed as output elements on the main surface of semiconductor substrate SUB.

This high-voltage nMOS transistor mainly has an n$^+$ drain region DR, an n$^-$ epitaxial layer EP, a p-type back gate region BR, an n$^+$ source region SR, a gate insulating layer GI, and a gate electrode layer GE.

N$^+$ drain region DR is formed on the main surface of semiconductor substrate SUB in n$^-$ epitaxial layer EP. P-type back gate region BR is formed on the main surface of semiconductor substrate SUB in n$^-$ epitaxial layer EP, and field insulating layer FI is sandwiched between p-type back gate region BR and n$^+$ drain region DR. N$^+$ source region SR is formed on the main surface of semiconductor substrate SUB within p-type back gage region BR. Gate electrode layer GE is formed on p-type back gate region BR sandwiched between n$^+$ source region SR and n$^-$ epitaxial layer EP with gate insulating layer GI interposed therebetween and partially lies on field insulating layer FI.

In output transistor formation region OER, an interlayer insulating layer II is formed to cover the high-voltage nMOS transistor. In this interlayer insulating layer II, a contact hole CH is formed which reaches each of n$^+$ drain region DR and n$^+$ source region SR, and a plug conductive layer PL is formed in each of these contact holes CH. An interconnection layer CL is formed on interlayer insulating layer II to electrically connect to each of n$^+$ drain region DR and n$^+$ source region SR through plug conductive layer PL.

In control circuit formation region CCR, a buried n$^+$ diffusion region NE is formed between p-type impurity region PSR and n-type epitaxial layer EP. In addition, in control circuit formation region CCR, a variety of elements for controlling an output element and the like are formed on the main surface of semiconductor substrate SUB.

Furthermore, in control circuit formation region CCR, the aforementioned interlayer insulating layer II is formed to cover a variety of elements for controlling an output element and the like. In this interlayer insulating layer II, contact hole CH is formed which reaches an n$^+$ diffusion region NR3, and plug conductive layer PL is formed in contact hole CH. Interconnection layer CL is formed on interlayer insulating layer II to electrically connect to n$^+$ diffusion region NR3 though plug conductive layer PL.

In active barrier region ABR, an active barrier structure is formed. This active barrier structure has a p-type region (third region) and an n-type region (fourth region), each of which is in contact with p-type impurity region PSR and which are ohmic-connected to each other through a conductive layer to attain a floating potential.

The p-type region that forms the active barrier structure has a buried p-type diffusion region PE, a p-type diffusion region PR2, and a p$^+$ diffusion region PR3. Buried p-type diffusion region PE is formed on p-type impurity region PSR in contact therewith. This buried p-type diffusion region PE has a concentration of, for example, $1.0 \times 10^{16}$ cm$^{-3}$ to $6.0 \times 10^{16}$ cm$^{-3}$. P-type diffusion region PR2 is formed on buried p-type diffusion region PE in contact therewith. P$^+$ type diffusion region PR3 is formed on the main surface of semiconductor substrate SUB within p-type diffusion region PR2.

On the other hand, the n-type region that forms the active barrier structure has a buried n$^+$ diffusion region NE, n$^-$ epitaxial layer EP, and an n$^+$ diffusion region NR1. Buried n$^+$ diffusion region NE is formed between p-type impurity region PSR and n$^-$ epitaxial layer EP. N$^+$ diffusion region NR1 is formed on the main surface of semiconductor substrate SUB in n$^-$ epitaxial layer EP.

The conductive layer that ohmic-connects the p-type region and the n-type region forming the active barrier structure has a pair of plug conductive layers PL and a conductive layer FCL. Each of a pair of plug conductive layers PL is formed in contact hole CH formed in the aforementioned interlayer insulating layer II. One of a pair of plug conductive layers PL is ohmic-connected to p$^+$ diffusion region PR3 and the other of a pair of plug conductive layers PL is ohmic-connected to n$^+$ diffusion region NR1. Conductive layer FCL is formed on interlayer insulating layer II and is electrically connected to each of a pair of plug conductive layers PL as described above.

In the present embodiment, a trench isolation structure TI is formed at least either between active barrier region ABR and output transistor formation region OER or between active barrier region ABR and control circuit formation region CCR. This trench isolation structure TI has a trench TR, a buried insulating layer EI, and a p$^+$ diffusion region (fifth region) PR1.

Trench TR is formed to extend from the upper surface of field insulating layer FI formed on the main surface of semiconductor substrate SUB through field insulating layer FI and n$^-$ epitaxial layer EP and then reach p-type impurity region PSR. Preferably, this trench TR extends to a position deeper than the lowermost part of each of buried p-type diffusion region PE and buried n$^+$ diffusion region NE relative to the main surface of semiconductor substrate SUB. Buried insulating layer EI is buried in trench TR. P$^+$ diffusion region PR1 is formed in p-type impurity region PSR to surround the lower end part of trench TR.

Now, a method of manufacturing a semiconductor device in accordance with the present embodiment will be described.

Figure 5:
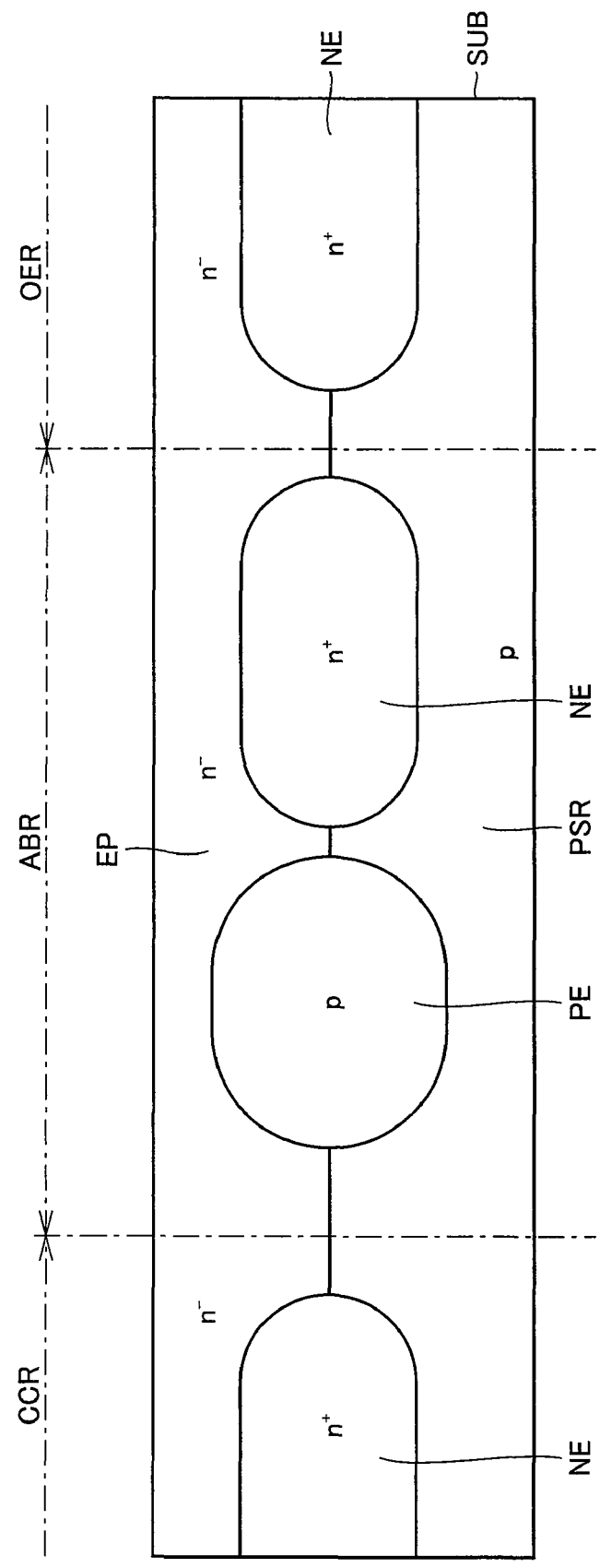
FIG. 5 to FIG. 7 are schematic cross-sectional views showing the steps of a method of manufacturing the semiconductor device in the first embodiment of the present invention, in order.

Referring to FIG. 5, the surface of semiconductor substrate SUB formed of p-type impurity region PSR is oxidized so that a silicon oxide film (not shown) having a thickness of, for example, 300 nm to 1000 nm is formed on that surface. By the usual photolithography technique, a photoresist pattern (not shown) is formed on the silicon oxide film. Using this resist pattern as a mask, the silicon oxide film is etched and then patterned. Thereafter, the resist pattern is removed, for example, by ashing or the like.

Using the patterned silicon oxide film as a mask, the main surface of p-type semiconductor substrate SUB is subjected to ion implantation of, for example, antimony. Thereafter, heat treatment is performed at, for example, 1240° C. so that n$^+$ diffusion region NE is formed on the main surface of semiconductor substrate SUB. Thereafter, the silicon oxide film on the main surface of semiconductor substrate SUB is removed.

The surface of p-type semiconductor substrate SUB is oxidized so that a silicon oxide film (not shown) having a thickness of, for example, 20 nm to 30 nm is formed on that surface. By the usual photolithography technique, a photoresist pattern (not shown) is formed on the silicon oxide film. Using this resist pattern as a mask, the silicon oxide film is etched and then patterned.

Using the patterned silicon oxide film as a mask, the main surface of p-type semiconductor substrate SUB is subjected to ion implantation of, for example, boron. Thereafter, the resist pattern is removed, for example, by ashing or the like. Then, p-type diffusion region PE is formed on the main surface of semiconductor substrate SUB by performing annealing at a temperature of, for example, 1150° C. Thereafter, the silicon oxide film on the main surface of semiconductor substrate SUB is removed.

Then, the main surface of semiconductor substrate SUB having n$^+$ diffusion region NE and p-type diffusion region PE formed therein undergoes epitaxial growth so that an n$^-$ epitaxial layer EP is formed on the main surface of semiconductor substrate SUB.

Figure 6:
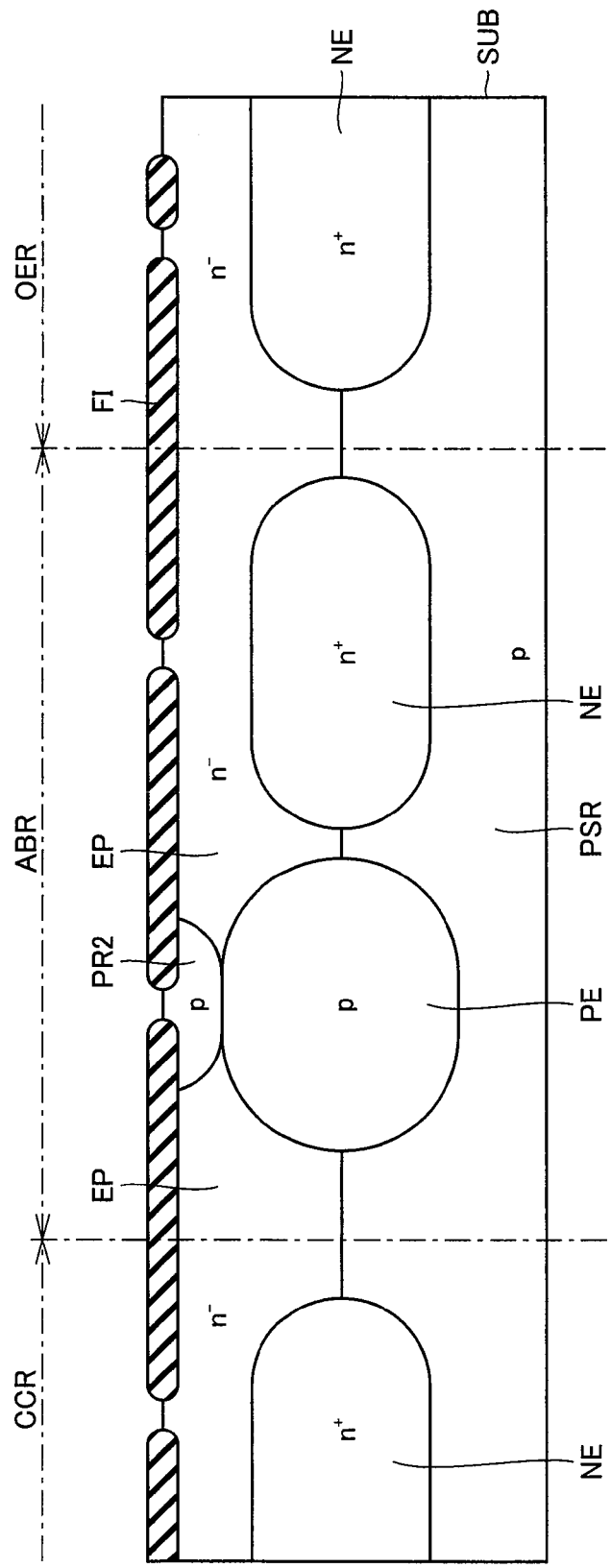

Referring to FIG. 6, the surface of n$^-$ epitaxial layer EP (the main surface of semiconductor substrate SUB) is oxidized so that a silicon oxide film (not shown) having a thickness of, for example, 20 nm to 30 nm is formed on that surface. By the usual photolithography technique, a photoresist pattern (not shown) is formed on that silicon oxide film. Using this resist pattern as a mask, the silicon oxide film is etched and then patterned. Thereafter, the resist pattern is removed, for example, by ashing or the like.

Using the patterned silicon oxide film as a mask, the surface of n$^-$ epitaxial layer EP is subjected to ion implantation of, for example, boron so that a p-type diffusion region PR2 is formed. Thereafter, the resist pattern is removed, for example, by ashing or the like. Then, field insulating layer FI is selectively formed on the main surface of semiconductor substrate SUB by LOCOS method.

Figure 7:
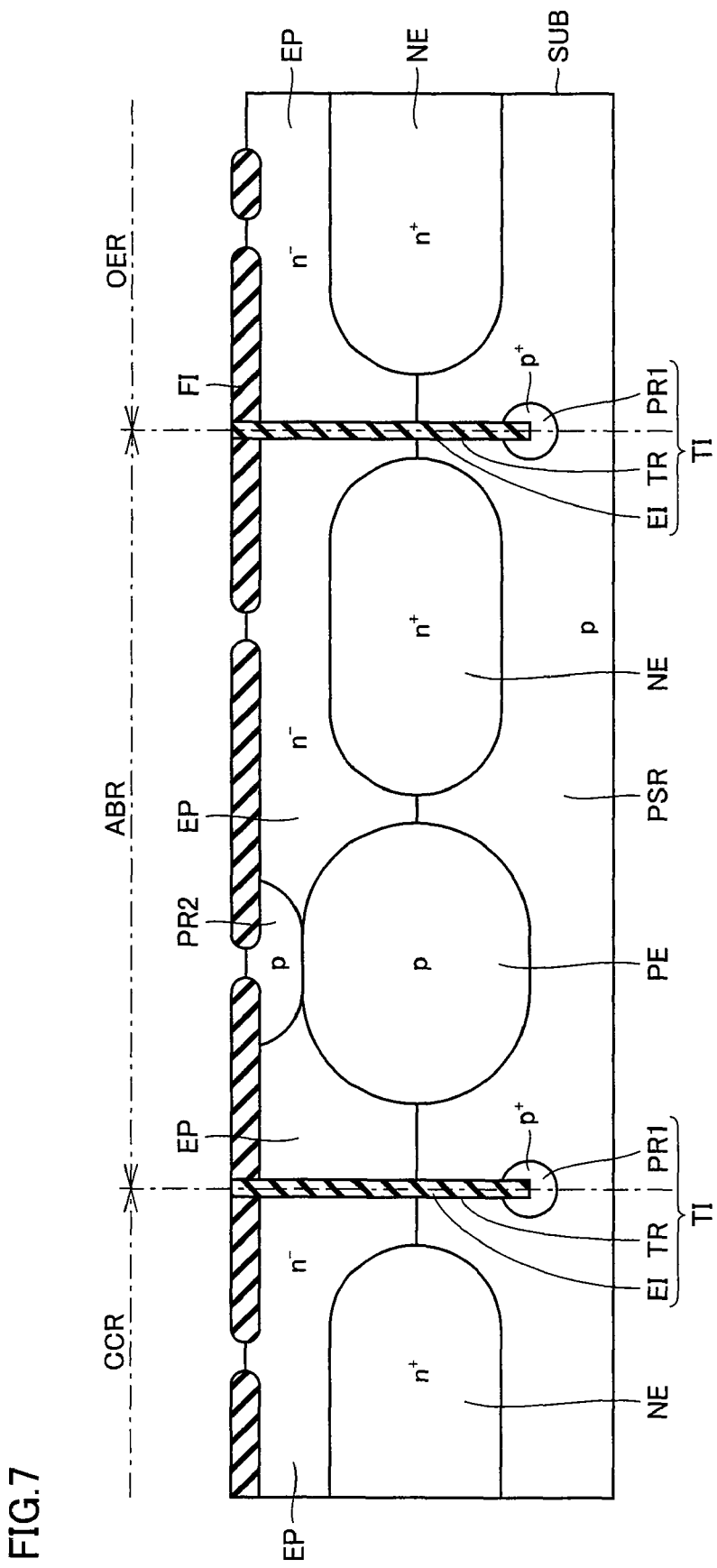

Referring to FIG. 7, after oxidation of 300 nm to 1000 nm is performed, a resist pattern is formed by a photolithography technique, and using the resist pattern as a mask, field insulating layer FI is selectively etched away. Thereafter, the resist pattern is removed, for example, by ashing or the like.

Then, using field insulating layer FI as selectively etched away as a mask, semiconductor substrate SUB is etched so that trench TR is formed in semiconductor substrate SUB. Oxidation is performed so that a silicon oxide film having a thickness of, for example, 20 nm to 30 nm is formed on the wall surface of trench TR. Thereafter, through ion implantation of boron, p$^+$ diffusion region PR1 is formed in semiconductor substrate SUB to surround the lower end part of trench TR. Thereafter, a silicon oxide film is deposited so that buried insulating layer EI is formed to fill in trench TR.

Referring to FIG. 4, the silicon oxide film is etched by a few tens of nm so that the main surface of semiconductor substrate SUB is exposed in the region where field insulating layer FI is not formed. Thereafter, through thermal oxidation, gate insulating layer GI formed of a silicon oxide film having a thickness of, for example, a few tens of nm is formed on the main surface of the exposed semiconductor substrate SUB.

Thereafter, an impurity-doped polysilicon film (referred to as a doped polysilicon film hereinafter) and a tungsten silicide (WSi$_2$) layer are laid on the entire surface in order. By the usual photolithography technique and etching technique, the laid doped polysilicon film and tungsten silicide layer are patterned, resulting in gate electrode layer GE.

Then, a resist pattern is formed by a photolithography technique, and using the resist pattern, the gate electrode, and the like as a mask, the main surface of semiconductor substrate SUB is subjected to ion implantation of, for example, boron. Therefore, p-type back gate region BR is formed on the main surface of semiconductor substrate SUB. Thereafter, the resist pattern is removed.

Then, a resist pattern is formed by a photolithography technique, and then using the resist pattern, the gate electrode and the like as a mask, the main surface of semiconductor substrate SUB is subjected to ion implantation of, for example, arsenic. Therefore, n$^+$ diffusion regions DR, SR, NR1, NR3 are formed on the main surface of semiconductor substrate SUB. Thereafter, the resist pattern is removed.

Then, a resist pattern is formed by a photolithography technique, and using the resist pattern, the gate electrode, and the like as a mask, the main surface of semiconductor substrate SUB is subjected to ion implantation of, for example, boron. Therefore, p$^+$ diffusion region PR3 is formed on the main surface of semiconductor substrate SUB. Thereafter, the resist pattern is removed.

Then, interlayer insulating layer II formed of, for example, a silicon oxide film is formed at a thickness of 500 nm to 1000 nm. Thereafter, by the usual photolithography technique and etching technique, contact hole CH which reaches each of n$^+$ diffusion regions DR, SR, NR1, NR3 and p$^+$ diffusion region PR3 is formed in interlayer insulating layer II.

A stacked film of a titanium (Ti) layer and a titanium nitride (TiN) layer and a tungsten (W) film, for example, are formed so as to fill in contact hole CH and are thereafter left only in contact hole CH by performing etching. Therefore, plug conductive layer PL is formed which fills in contact hole CH.

Then, after a conductive layer formed of, for example, AlCu or AlSiCu is deposited on interlayer insulating layer II, this conductive layer is patterned by the usual photolithography technique and etching technique, resulting in interconnection layer CL and conductive layer FCL.

As described above, a semiconductor device in accordance with the present embodiment is thus fabricated.

Now, the operation and effect of the semiconductor device in accordance with the present embodiment will be described.

Figure 8:
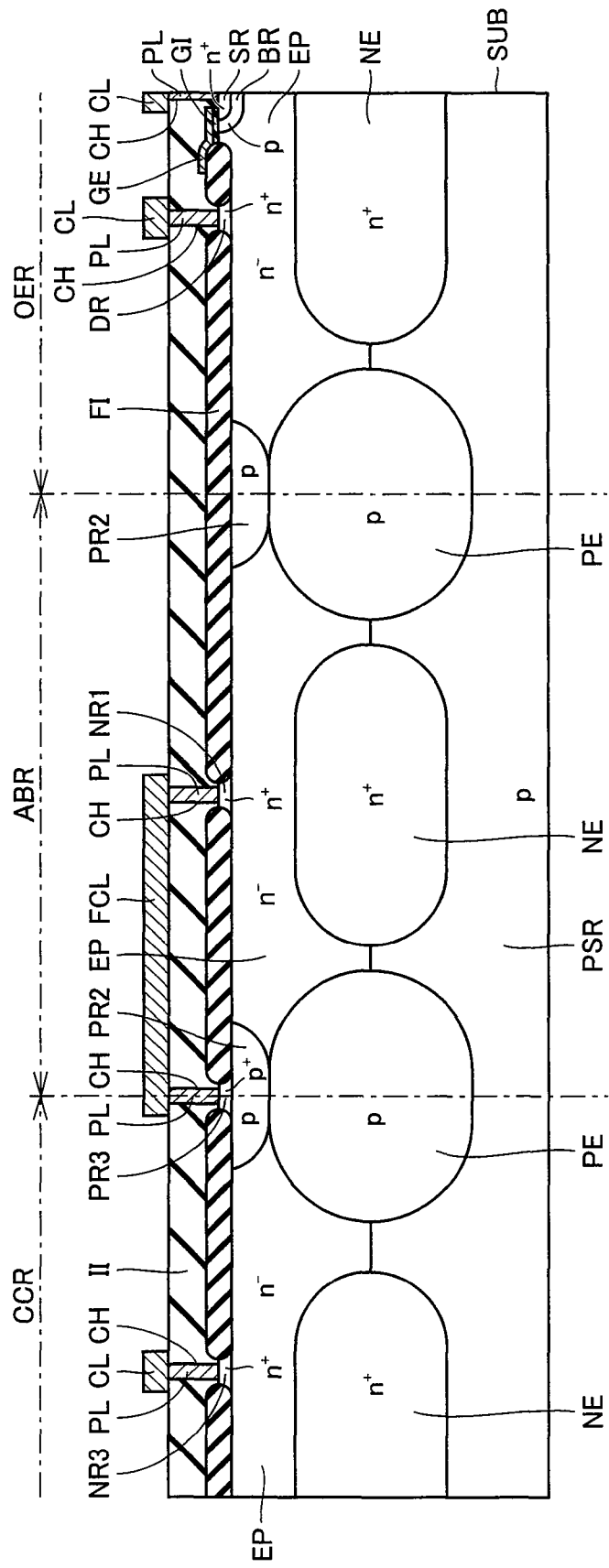
FIG. 8 is a cross-sectional view schematically showing a configuration in which an active barrier region and an output transistor formation region are isolated from each other by a p-type diffusion region.

Referring to FIG. 8, this structure differs from the configuration of the first embodiment shown in FIG. 4 in that the active barrier region and the output transistor formation region are isolated from each other by a p-type diffusion region.

The p-type diffusion region which isolates active barrier region ABR from output transistor formation region OER has buried p-type diffusion region PE and p-type diffusion region PR2. Buried p-type diffusion region PE of the p-type diffusion region for isolation is fabricated in the same manufacturing step as buried p-type diffusion region PE that forms the active barrier structure. Furthermore, p-type diffusion region PR2 of the p-type diffusion region for isolation is fabricated in the same manufacturing step as p-type diffusion region PR2 that forms the active barrier structure.

Buried p-type diffusion region PE and p-type diffusion region PR2 that form the active barrier structure also serve as a p-type diffusion region which isolates active barrier region ABR from control circuit formation region CCR.

The other configuration of the structure in FIG. 8 is almost the same as the configuration in the foregoing first embodiment, and therefore the same components are denoted with the same characters and the description thereof will not be repeated.

When the output transistor in FIG. 8 is connected to inductive load IL as shown in FIG. 1 and when MOS transistor HTR shown in FIG. 1 is in the ON state and MOS transistor LTR is in the OFF state, current flows from MOS transistor HTR into inductive load IL. In this state, when MOS transistor LTR is switched to the ON state with MOS transistor HTR in the OFF state, inductive load IL tends to keep current flowing. Thus, an electromotive force occurs, so that current flows through parasitic diodes D1, D2 of MOS transistor LTR.

Figure 9:
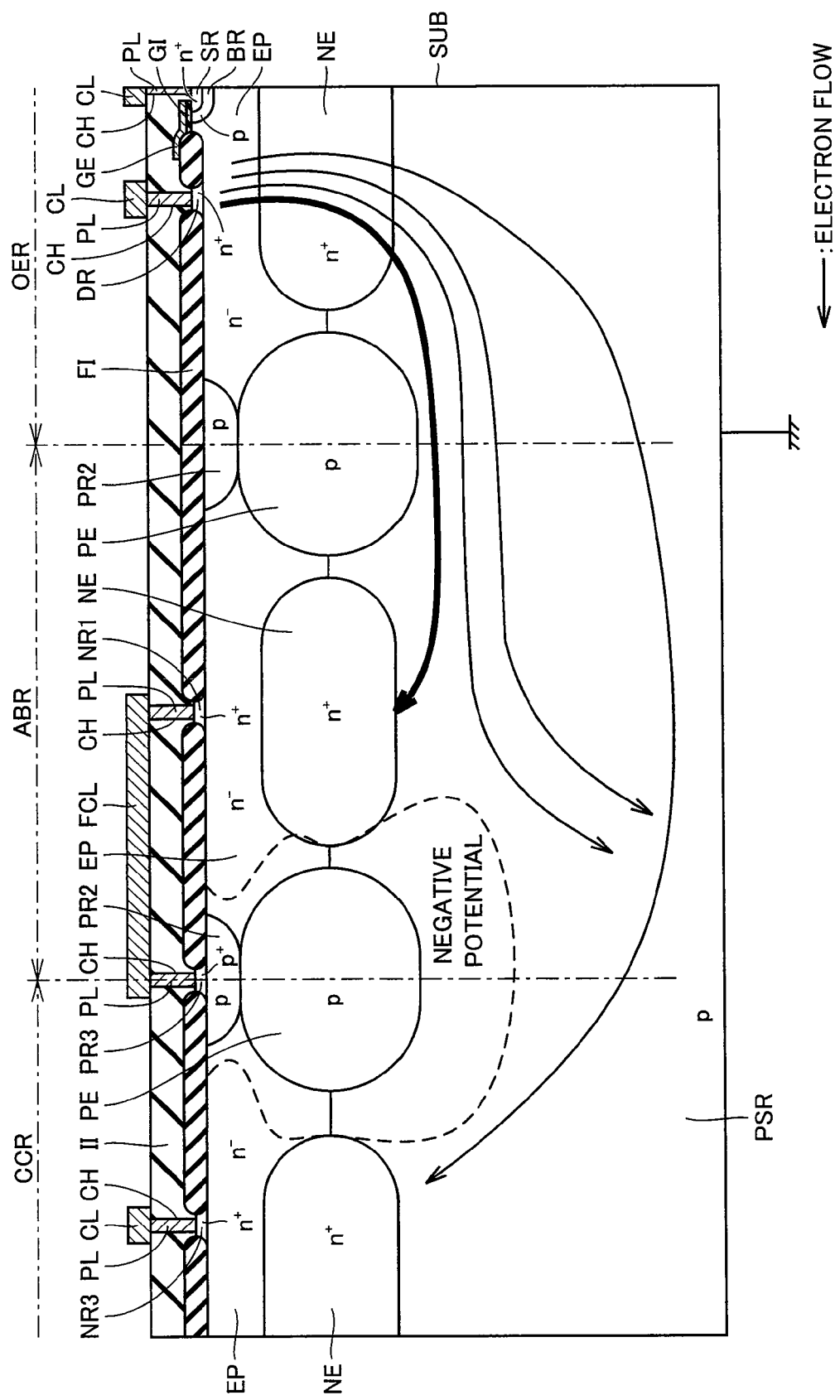
FIG. 9 is a schematic cross-sectional view showing electrons injected from a MOS transistor of an output element in the structure shown in FIG. 8.

More specifically, in FIG. 8, n$^+$ drain region DR of high-voltage nMOS transistor in the output transistor formation region attains a negative potential, and as shown by the arrow in FIG. 9, electrons are injected from n$^+$ drain region DR into p-type impurity region PSR of semiconductor substrate SUB. The electrons injected into p-type impurity region PSR disappear in p-type impurity region PSR due to recombination or are taken into buried n⁺ diffusion region NE of active barrier region ABR.

Electrons are taken into buried n⁺ diffusion region NE of active barrier region ABR so that buried n⁺ diffusion region NE attains a positive potential. Since the n-type region and the p-type region having a floating potential are ohmic-connected through the conductive layer in the active barrier region ABR, when the n-type region attains a positive potential, in order to cancel this, the p-type region (buried p-type diffusion region PE and p-type diffusion region PR2) of active barrier region ABR attains a negative potential.

When the p-type region of active barrier region ABR attains a negative potential, the electrons injected in p-type impurity region PSR hardly move forward from the p-type region (buried p-type diffusion region PE and p-type diffusion region PR2) having a negative potential, and it is more likely that the electrons disappear due to recombination. Thus, the electrons hardly reach control circuit formation region CCR from active barrier region ABR, thereby preventing a malfunction of the other elements in control circuit formation region CCR.

In this manner, when electrons are injected from n⁺ drain region DR of high-voltage NMOS transistor in output transistor formation region OER into semiconductor substrate SUB, active barrier region ABR has a function of preventing the electrons from reaching control circuit formation region CCR.

Figure 10:
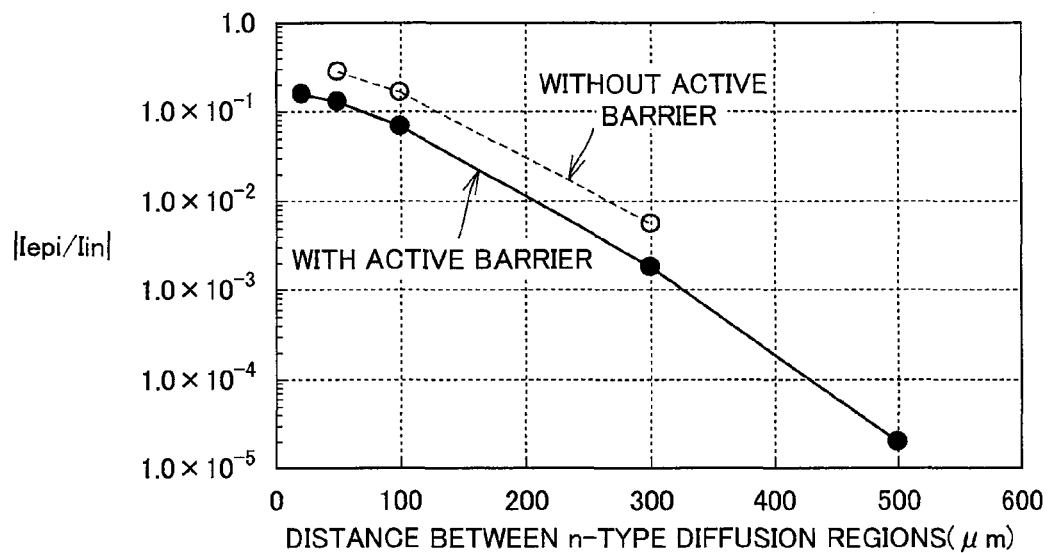
FIG. 10 is a diagram showing the proportion of electrons reaching an n-type diffusion region (n⁻ epitaxial layer EP) on the electron receiving side (the control circuit formation region CCR side) depending on the presence or absence of the active barrier region.

The axis of abscissas in FIG. 10 shows the distance between the n-type diffusion region (n⁻ epitaxial layer EP) on the electron injection side (the output transistor formation region OER side) and the n-type diffusion region (n⁻ epitaxial layer EP) on the electron receiving side (the control circuit formation region CCR side). Furthermore, the axis of ordinates shows the ratio (|Iepi/Iin|) of current Iepi on the electron receiving side to current Iin on the electron injection side.

The result in FIG. 10 also indicates that when the distance between the n-type diffusion regions is the same, electrons are less likely to reach the electron receiving side in the structure having the active barrier region than in the structure having no active barrier region.

In the configuration shown in FIG. 8, however, since the isolation between active barrier region ABR and the other region is achieved by the p-type diffusion region (buried p-type diffusion region PE and p-type diffusion region PR2), the diffusion of impurity in the p-type diffusion region inevitably increases the two-dimensional area occupied by the isolation region.

In addition, it has been found that in the isolation structure using the p-type diffusion region, the effect of preventing the movement of electrons from output transistor formation region OER to control circuit formation region CCR is not enough.

As a result of elaborate study, the inventor has found that when the isolation between active barrier region ABR and the other region is achieved by trench isolation, the two-dimensional occupied area can be reduced and, in addition, the effect of preventing movement of electrons from output transistor formation region OER to control circuit formation region CCR can be enhanced.

Figure 11:
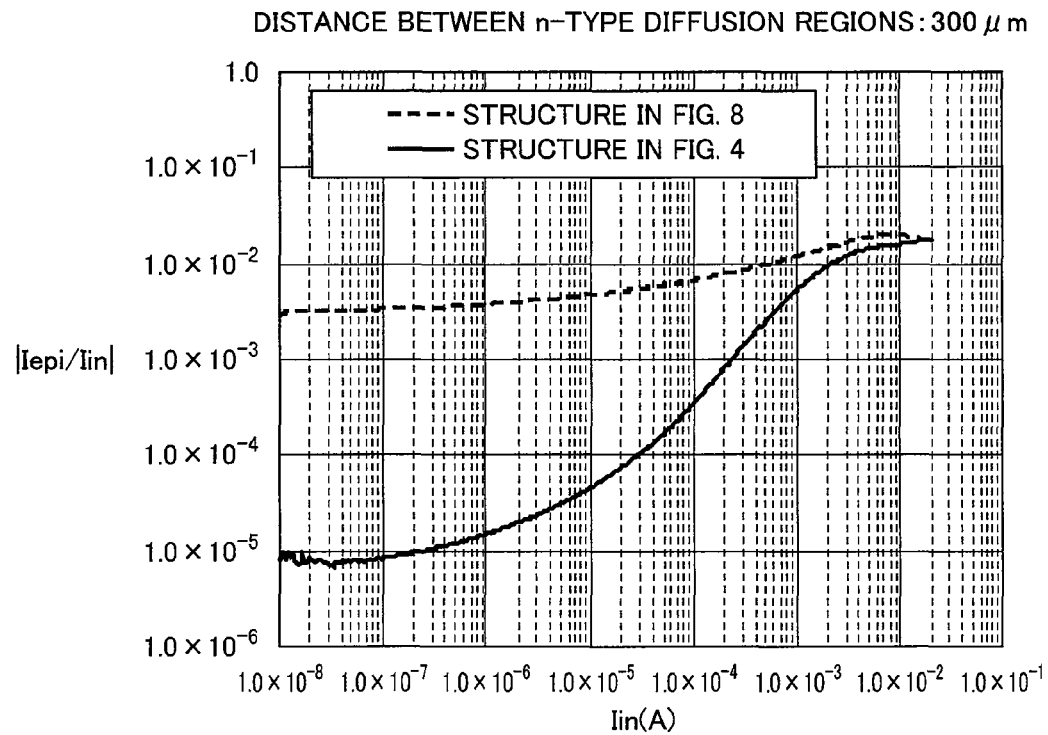
FIG. 11 is a diagram showing how the current ratio (Iepi/Iin) changes with respect to current Iin on the electron injection side for the structure in FIG. 4 and the structure in FIG. 8.

In this regard, the inventor examined how the current ratio (|Iepi/Iin|) changed with respect to current Iin on the electron injection side for the structure of the present embodiment shown in FIG. 4 and the structure shown in FIG. 8. The result is shown in FIG. 11. It is noted that the result in FIG. 11 is obtained when the distance between the n-type diffusion region (n⁻ epitaxial layer EP) on the electron injection side (the output transistor formation region OER side) and the n-type diffusion region (n⁻ epitaxial layer EP) on the electron receiving side (the control circuit formation region CCR side) is 300 μm.

The result in FIG. 11 indicates that when the same current Iin flows on the electron injection side, the current ratio (|Iepi/Iin|) is smaller in the structure in FIG. 4 than in the structure in FIG. 8 and electrons are less likely to reach the electron receiving side. It can be assumed that this effect can be obtained by the following mechanism.

In the isolation by the pn junction shown in FIG. 8, n⁻ epitaxial layer EP and p-type diffusion regions PE, PR2 for isolation are formed on the same monocrystal substrate so that electrons easily pass through this pn junction. Therefore, electrons easily pass through this pn junction and reach control circuit formation region CCR from output transistor formation region OER through active barrier region ABR.

On the contrary, in the structure of the present embodiment in FIG. 4, because of the formation of trench isolation, the continuity of crystal between n⁻ epitaxial layer EP in active barrier region ABR and n⁻ epitaxial layer EP in the other region is interrupted by trench TR. In addition, since buried insulating layer EI is filled in trench TR, a different material exists between n⁻ epitaxial layer EP in active barrier region ABR and n⁻ epitaxial layer EP in the other region.

Thus, in the structure of the present embodiment in FIG. 4, the passage of electrons in the trench isolation is more difficult than the passage through the pn junction portion, so that electrons cannot reach the region on the other side of the trench without bypassing the trench isolation. Therefore, it is assumed that the probability that electrons disappear due to recombination is increased and the proportion of electrons arriving at the electron receiving side from the electrons-injected side is decreased.

Furthermore, the result shown in FIG. 11 is obtained when the two-dimensional size is the same in the isolation by p-type regions PE, PR2 shown in FIG. 8 and in the isolation by trench TR shown in FIG. 4. Therefore, even if the two-dimensional size of the isolation by trench TR shown in FIG. 4 is made smaller than the two-dimensional size of the isolation by p-type regions PE, PR2 shown in FIG. 8, the obtained effect is equivalent or more. Thus, in the configuration of the present embodiment shown in FIG. 4, the isolation structure is easily reduced in size and the chip size is easily decreased.

Figure 12:
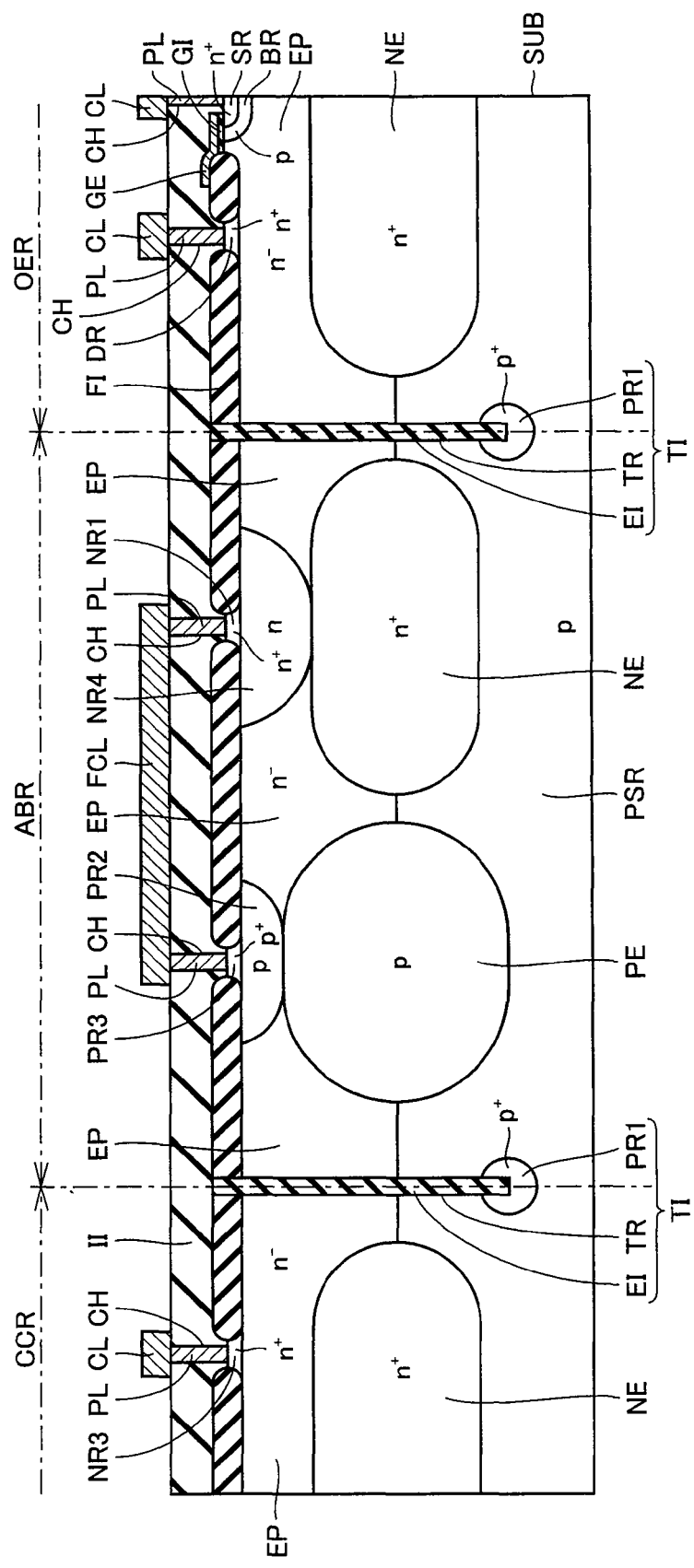
FIG. 12 is a cross-sectional view schematically showing a configuration in which an n-type diffusion region NR4 is added to the active barrier structure in FIG. 4.

Here, as shown in FIG. 12, the n-type region that forms the active barrier structure may have an n-type diffusion region NR4 other than buried n⁺ diffusion region NE, n⁻ epitaxial layer EP, and n⁺ diffusion region NR1. This n-type diffusion region NR4 is formed on buried n⁺ diffusion region N in contact therewith on buried n⁺ diffusion region NE. Furthermore, n⁺ diffusion region NR1 is formed on the main surface of the semiconductor substrate within n-type diffusion region NR4.

The other configuration of the structure shown in FIG. 12 is almost the same with the configuration shown in FIG. 4, and therefore the same components are denoted with the same characters and the description thereof will not be repeated.

Figure 13:
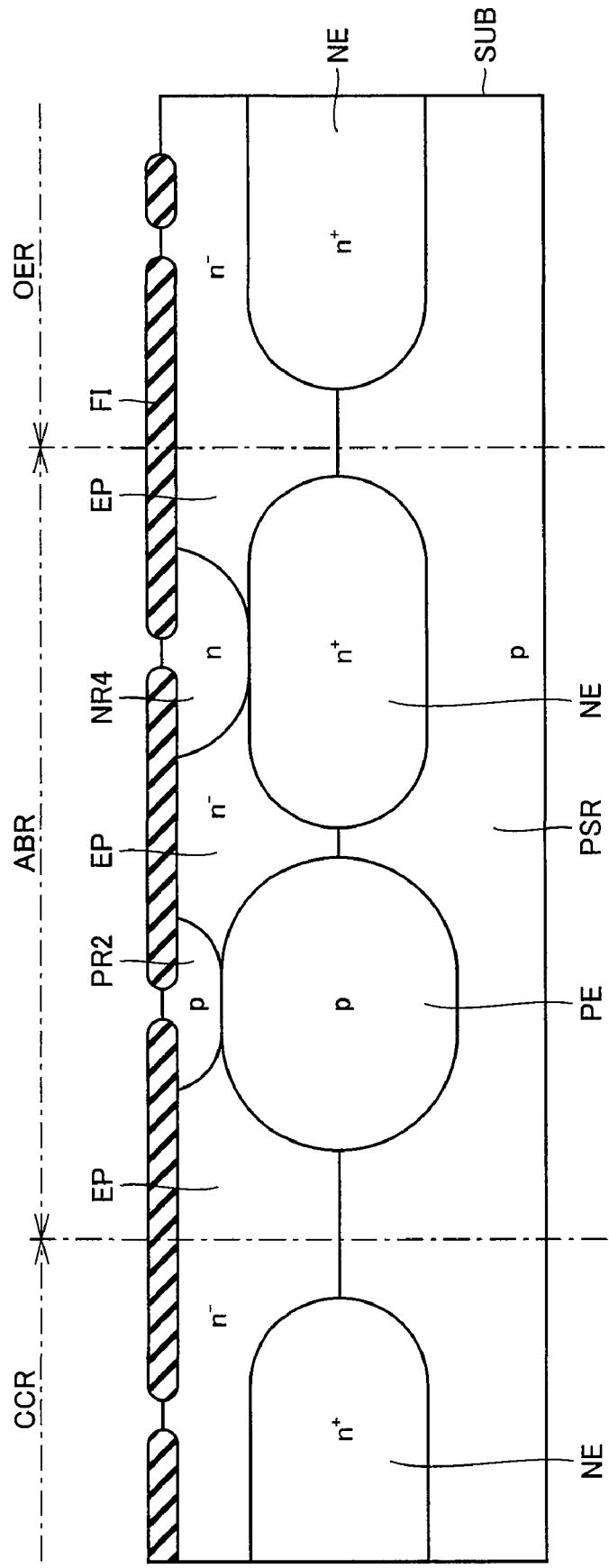
FIG. 13 is a view for illustrating a method of manufacturing the configuration in FIG. 12.

In a method of manufacturing the structure in FIG. 12, first, the process step shown in FIG. 5 is performed. Thereafter, referring to FIG. 13, the outermost surface of n⁻ epitaxial layer EP is oxidized so that a silicon oxide film of a thickness of, for example, 300 nm to 1000 nm is formed. This silicon oxide film is patterned by the usual photolithography technique and etching technique phosphosilicate glass is deposited on the patterned silicon oxide film, followed by heat treatment at a temperature of 1100° C. Thus, phosphorous diffuses from phosphosilicate glass onto the surface of n⁻ epitaxial layer EP exposed from the silicon oxide film serving as a mask, resulting in n-type diffusion region NR4. Thereafter, the silicon oxide film used as a mask is removed.

Here, the subsequent steps are almost the same with those of the method of manufacturing the structure shown in FIG. 4 and therefore the description thereof will not be repeated.

Second Embodiment

Figure 14:
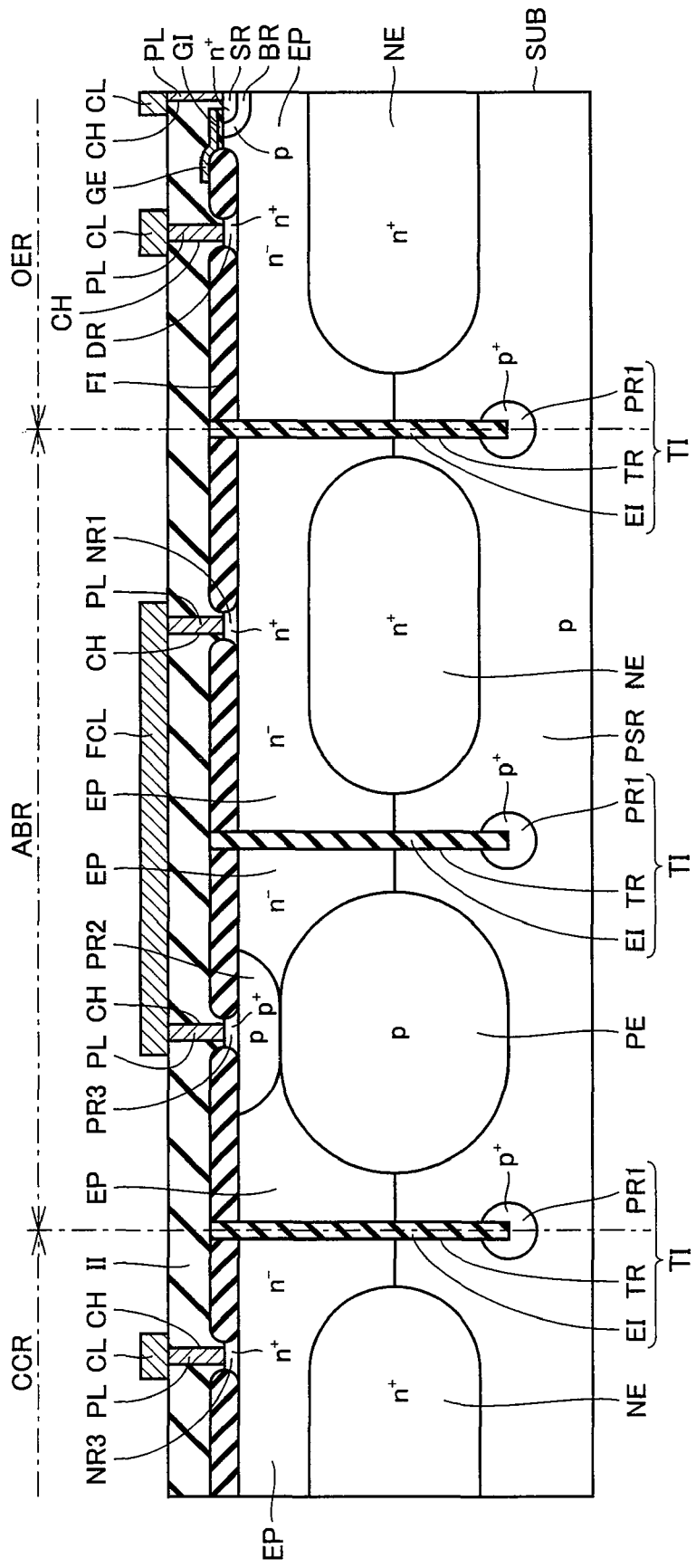
FIG. 14 is a cross-sectional view schematically showing a configuration of a semiconductor device in a second embodiment of the present invention.

Referring to FIG. 14, the configuration of the present embodiment differs from the configuration of the first embodiment shown in FIG. 4 in that a trench structure is added.

In the present embodiment, trench TR is formed to extend from the main surface of semiconductor substrate SUB to between buried p-type diffusion region PE and buried n⁺ diffusion region NE in active barrier region ABR. Buried insulating layer EI is formed in trench TR. In addition, p⁺ diffusion region PR1 is formed to surround the lower end part of trench TR.

This trench TR passes through n⁻ epitaxial layer EP to reach p-type impurity region PSR. Furthermore, this trench TR preferably extends to a position deeper than the lowermost part of buried p-type diffusion region PE and buried n⁺ diffusion region NE relative to the main surface of semiconductor substrate SUB.

Here, the other configuration of the structure of the present embodiment is almost the same with the configuration of the foregoing first embodiment, and therefore the same components are denoted with the same characters and the description thereof will not be repeated.

Figure 15:
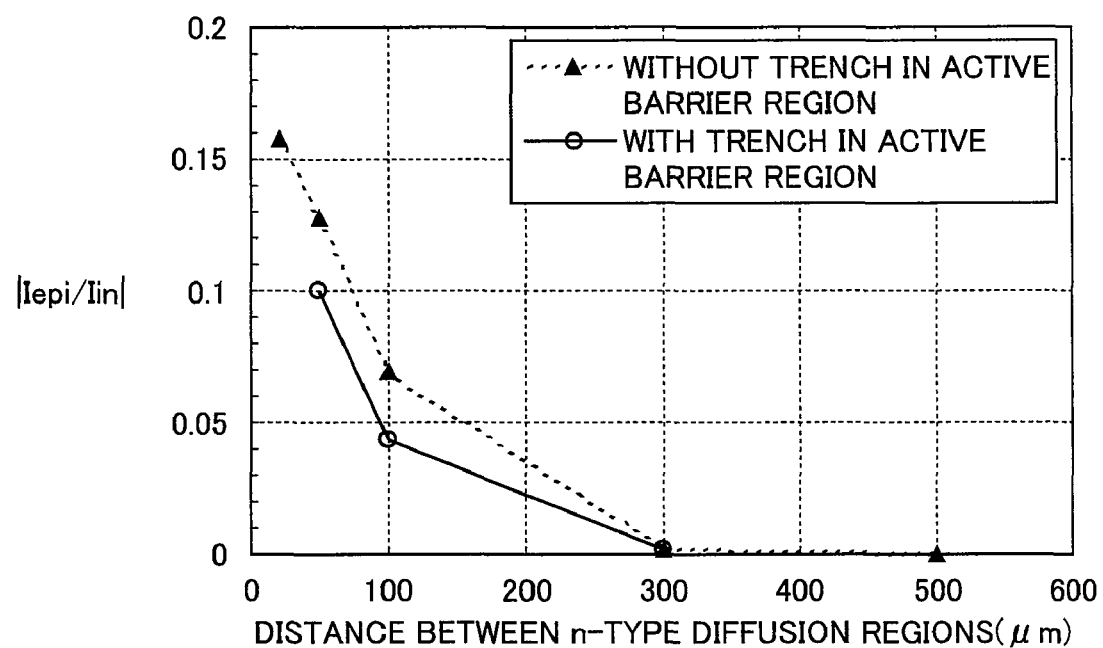
FIG. 15 is a diagram showing the changing current ratio (|Iepi/Iin|) with respect to the distance between n-type diffusion regions for the structure shown in FIG. 14 and the structure shown in FIG. 4.

Referring to FIG. 15, it is understood that by adding trench isolation as shown in FIG. 14, the proportion of electrons arriving at the electron receiving side from the electron injection side can be further reduced.

As described above, in the present embodiment, the chip size can easily be reduced, and in addition, the proportion of electrons arriving at the electron receiving side from the electron injection side can be further reduced, thereby further preventing a malfunction of an element on the electron receiving side.

Figure 16:
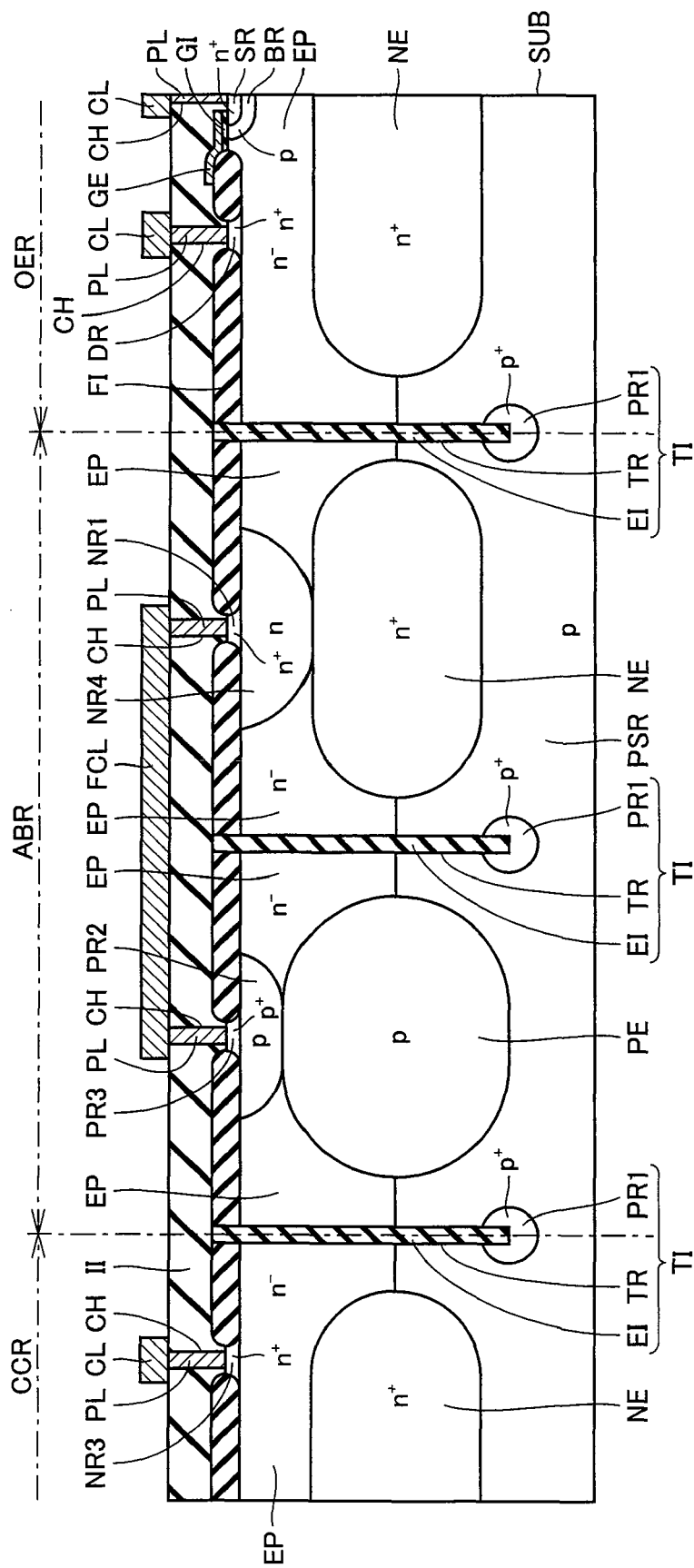
FIG. 16 is a cross-sectional view schematically showing a configuration in which n-type diffusion region NR4 is added to the active barrier structure in FIG. 14.

Here, as shown in FIG. 16, the n-type region that forms the active barrier structure may have n-type diffusion region NR4 other than buried n⁺ diffusion region NE, n⁻ epitaxial layer EP, and n⁺ diffusion region NR1. This n-type diffusion region NR4 is formed on buried n⁺ diffusion region N in contact therewith on buried n⁺ diffusion region NE. Furthermore, n⁺ diffusion region NR1 is formed on the main surface of the semiconductor substrate within n-type diffusion region NR4.

Third Embodiment

Figure 17:
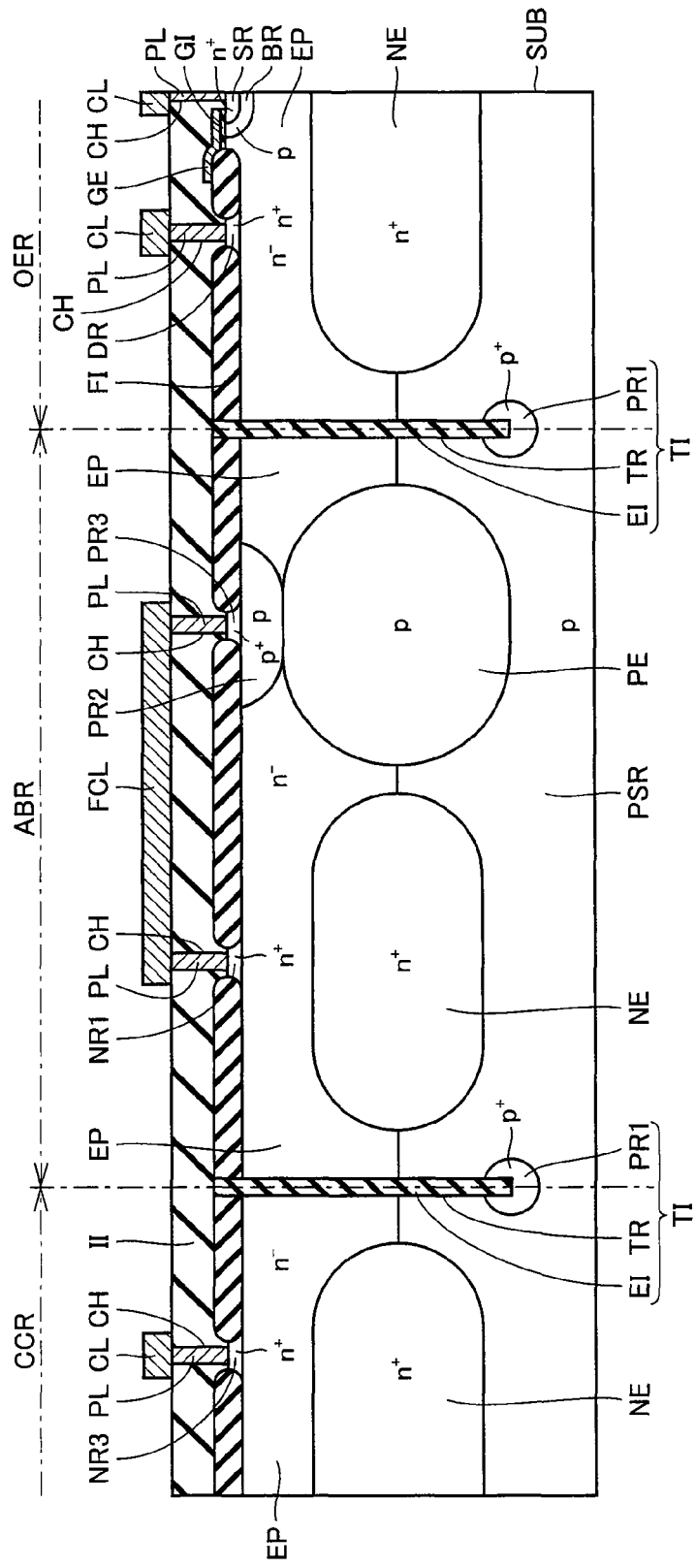
FIG. 17 is a cross-sectional view schematically showing a configuration of a semiconductor device in a third embodiment of the present invention.

Referring to FIG. 17, the configuration of the present embodiment differs from the configuration of the first embodiment shown in FIG. 4 in that the p-type diffusion region and the n-type diffusion region that form the active barrier structure are reversely arranged.

In the present embodiment, the p-type diffusion region (buried p-type diffusion region PE, p-type diffusion region PR2, p⁺ diffusion region PR3) that forms the active barrier structure is positioned on the output transistor formation region OER side while the n-type diffusion region (buried n⁺ diffusion region NE, n⁺ diffusion region NR1) is positioned on the control circuit formation region CCR side.

Here, the other configuration of the structure of the present embodiment is almost the same with the configuration of the foregoing first embodiment, and therefore the same components are denoted with the same characters and the description thereof will not be repeated.

Figure 18:
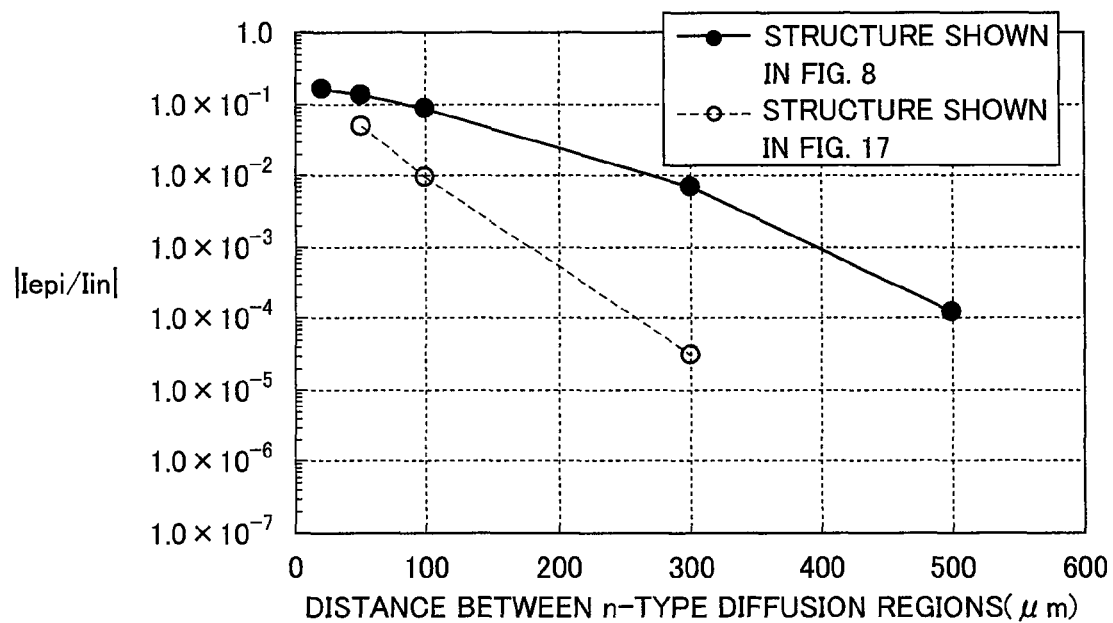
FIG. 18 is a diagram showing the changing current ratio (|Iepi/Iin|) with respect to the distance between n-type diffusion regions for the structure shown in FIG. 17 and the structure shown in FIG. 8.

Referring to FIG. 18, even when the p-type diffusion region and the n-type diffusion region that form the active barrier structure are reversely arranged as shown in FIG. 17, the proportion of electrons arriving at the electron receiving side from the electron injection side is reduced as compared with the configuration of FIG. 8.

As described above, in the present embodiment, the chip size can easily be reduced and, in addition, the proportion of electrons arriving at the electron receiving side from the electron injection side can be reduced, thereby preventing a malfunction of an element on the electron receiving side.

Figure 19:
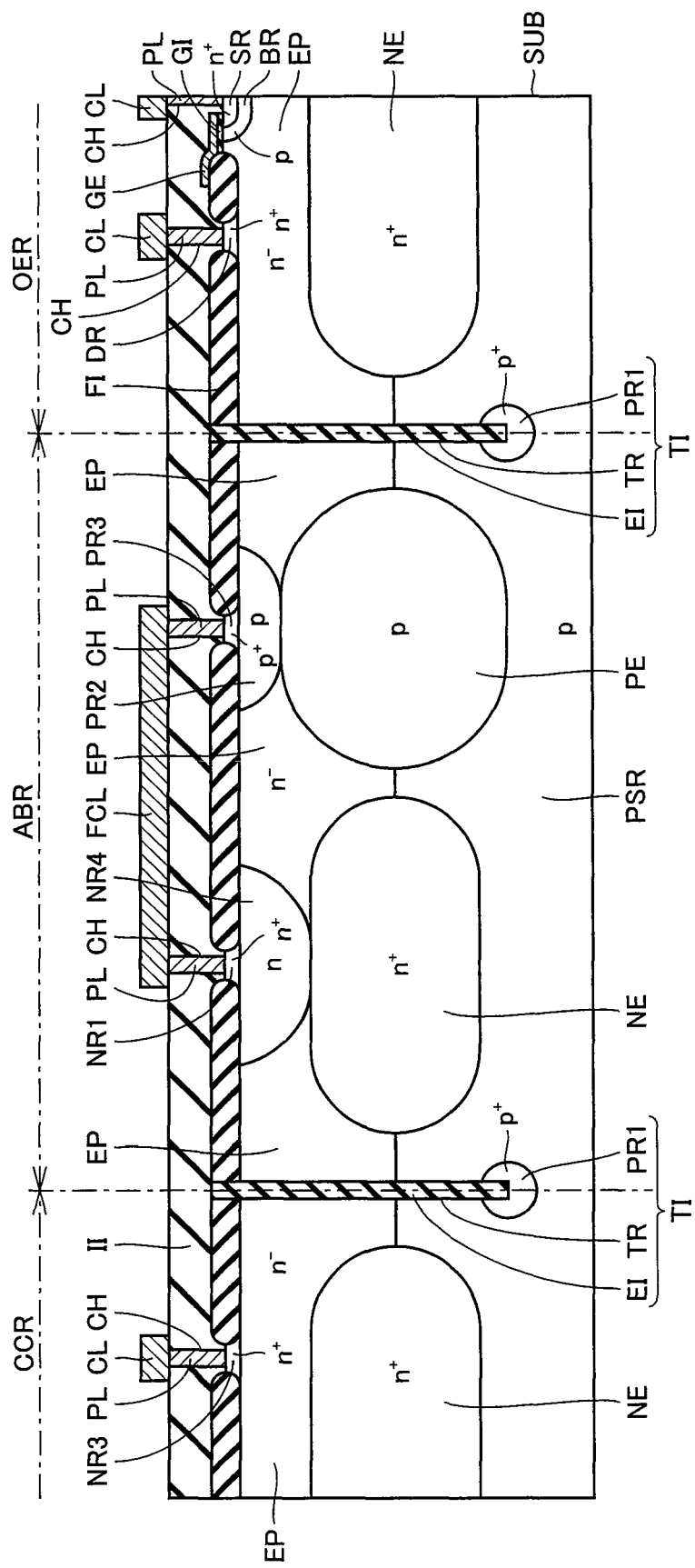
FIG. 19 is a cross-sectional view schematically showing a configuration in which n-type diffusion region NR4 is added to the active barrier structure in FIG. 17.

Here, as shown in FIG. 19, the n-type region that forms the active barrier structure may have n-type diffusion region NR4 other than buried n⁺ diffusion region NE, n⁻ epitaxial layer EP, and n⁺ diffusion region NR1. This n-type diffusion region NR4 is formed on n⁺ diffusion region N in contact therewith on buried n⁺ diffusion region NE. Furthermore, n⁺ diffusion region NR1 is formed on the main surface of the semiconductor substrate within n-type diffusion region NR4.

Although in the first to third embodiments as described above, a high-voltage MOS transistor has been described as an output element formed in output transistor formation region OER, an output element is not limited thereto and may be an IGBT (Insulate Gate Bipolar Transistor), a diode, or the like.

Figure 20:
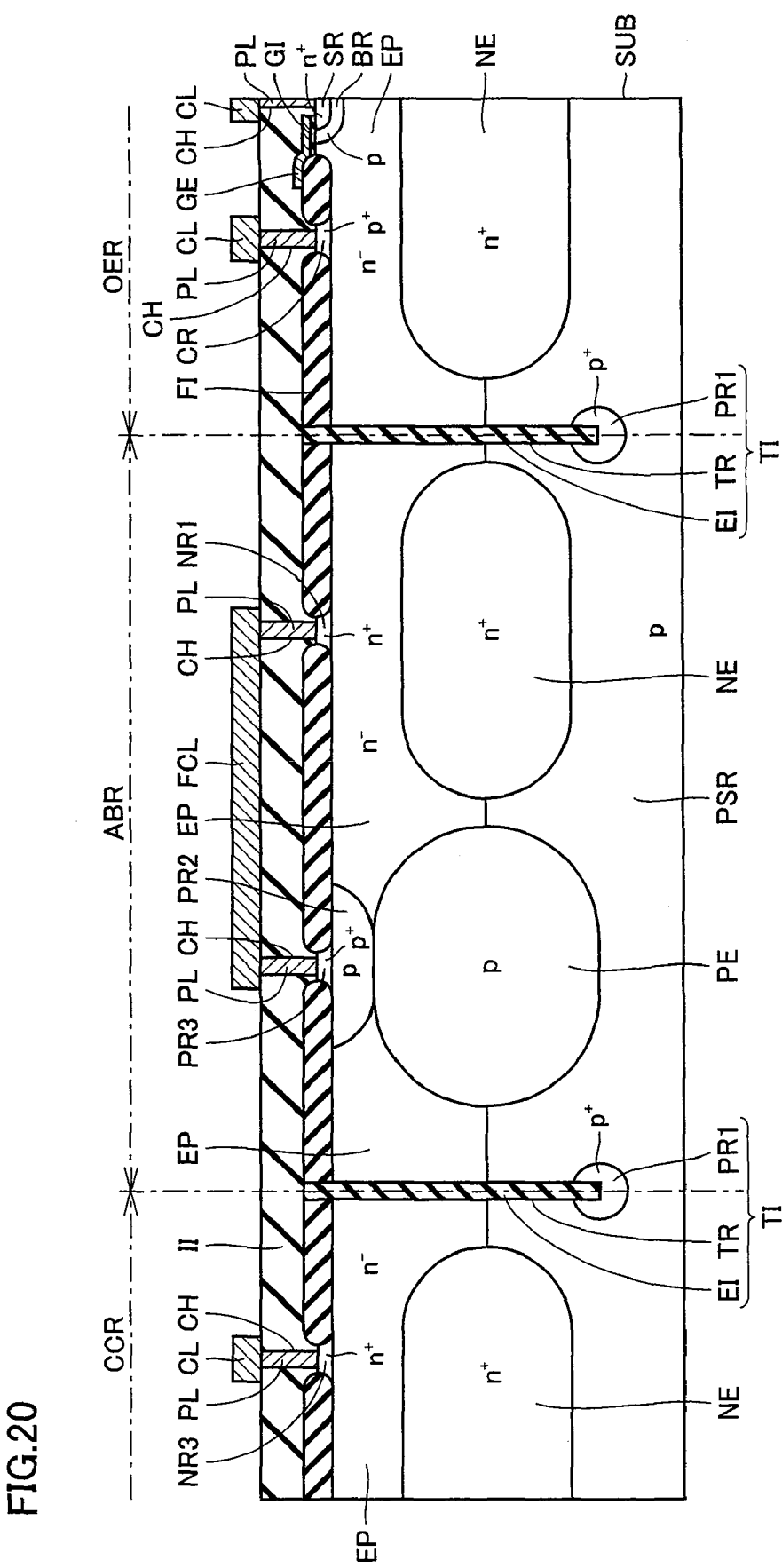
FIG. 20 is a cross-sectional view schematically showing a configuration in which an IGBT is employed as an output element.

Referring to FIG. 20, an IGBT is formed as an output element in output transistor formation region OER. This IGBT has a p⁺ collector region CR, an n⁻ epitaxial layer EP, a p-type back gate region BR, an n⁺ source region (emitter region) SR, and a gate insulating layer GI, and a gate electrode layer GE.

P⁺ collector region CR is formed on the main surface of semiconductor substrate SUB within n⁻ epitaxial layer EP. P-type back gate region BR is formed on the main surface of semiconductor substrate SUB within n⁻ epitaxial layer EP and is formed with field insulating layer FI interposed between p-type back gate region BR and p⁺ collector region CR. N⁺ source region SR is formed on the main surface of semiconductor substrate SUB within p-type back gate region BR. Gate electrode layer GE is formed on p-type back gate region BR sandwiched between n⁺ source region SR and n⁻ epitaxial layer EP with gate insulating layer GI interposed and partially lies on filed insulating layer FI.

Here, the other configuration in FIG. 20 is almost the same with the configuration of the first embodiment shown in FIG. 4 as described above, and therefore the same components are denoted with the same reference characters and the description thereof will not be repeated.

Figure 21:
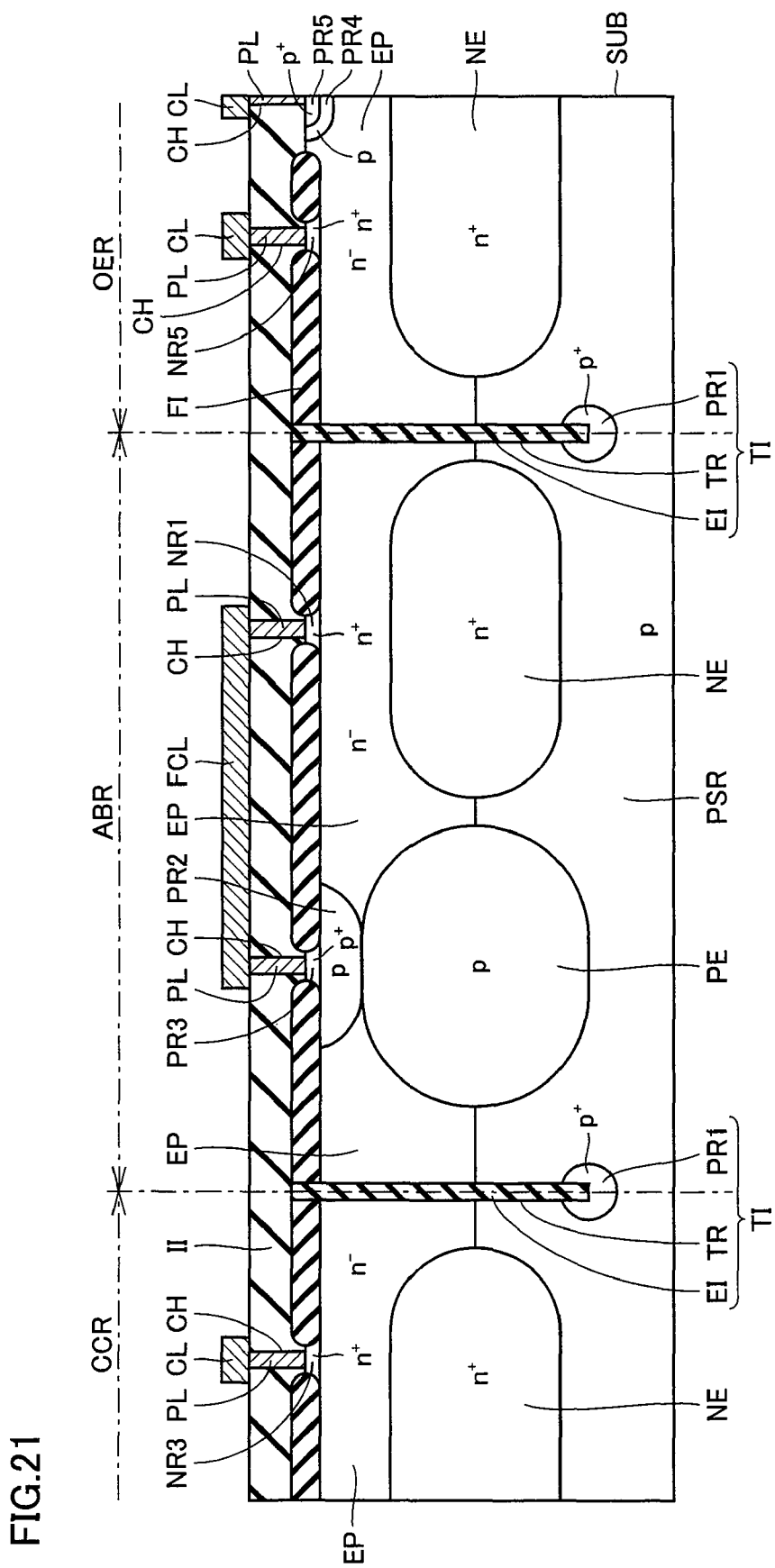
FIG. 21 is a cross-sectional view schematically showing a configuration in which a diode is employed as an output element.

Referring to FIG. 21, a diode is formed as an output element in output transistor formation region OER. This diode has an n⁺ diffusion region NR5, n⁻ epitaxial layer EP, p-type diffusion region PR4, and a p⁺ diffusion region PR5.

N⁺ diffusion region NR5 is formed on the main surface of semiconductor substrate SUB within n⁻ epitaxial layer EP. P-type diffusion region PR4 is formed on the main surface of semiconductor substrate SUB within n⁻ epitaxial layer EP. P⁺ diffusion region PR5 is formed on the main surface of semiconductor substrate SUB within p-type diffusion region PR4.

Here, the other configuration in FIG. 21 is almost the same with the configuration of the first embodiment shown in FIG.

4 as described above, and therefore the same components are denoted with the same characters and the detailed description thereof will not be repeated.

Figure 22:
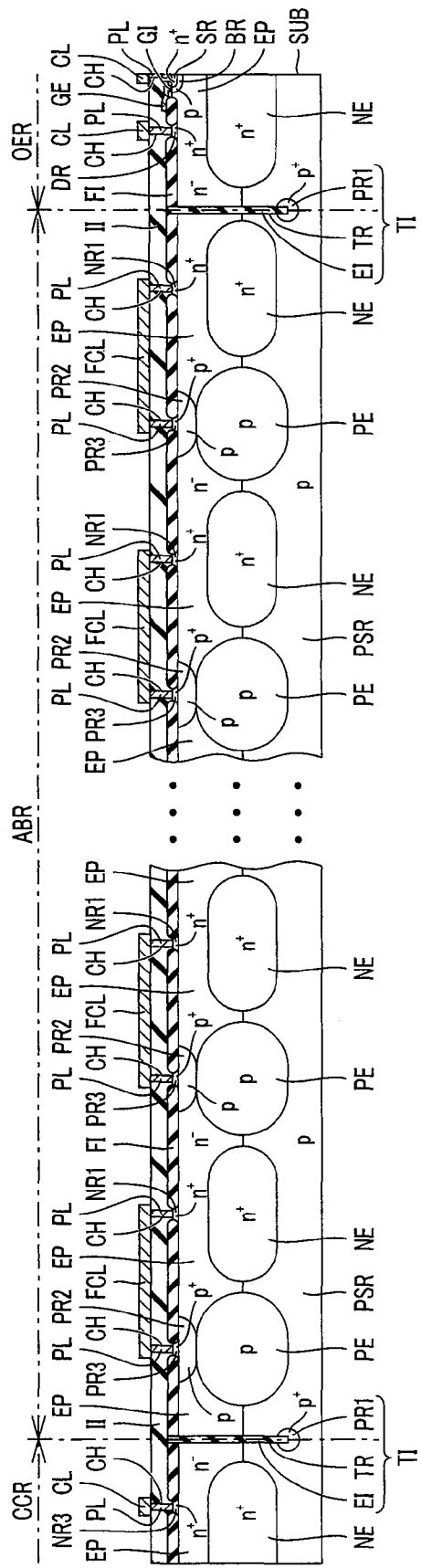
FIG. 22 is a schematic cross-sectional view showing that a plurality of active barrier structures are formed between an output transistor formation region OER and a control circuit formation region CCR.

Furthermore, although in the foregoing first to third embodiments, one active barrier structure is provided between output transistor formation region OER and control circuit formation region CCR, a plurality of active barrier structures may be formed between output transistor formation region OER and control circuit formation region CCR as shown in FIG. 22.

The present invention may advantageously be adopted specifically to a semiconductor device having an active barrier region.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device having an output element formation region, an other element formation region, and an active barrier region arranged between said output element formation region and said other element formation region, comprising:
    a semiconductor substrate having a main surface,
    a first region of a first conductivity type formed in said semiconductor substrate in said output element formation region, said other element formation region, and said active barrier region;
    a second region of a second conductivity type formed in said semiconductor substrate in said output element formation region, said other element formation region, and said active barrier region so as to form a pn junction with said first region and to be positioned on the main surface side of said semiconductor substrate rather than said first region;
    an active barrier structure having a third region of the first conductivity type and a fourth region of the second conductivity type, each of which is in contact with said first region and which are ohmic-connected to each other to attain a floating potential, in said active barrier region; and
    a trench isolation structure having a trench formed at least one of between said active barrier region and said output element formation region and between said active barrier region and said other element formation region and formed to extend from the main surface of said semiconductor substrate through said second region and then reach said first region.

2. The semiconductor device according to claim 1, wherein said trench extends to a position deeper than said third region and said fourth region relative to the main surface of said semiconductor substrate.

3. The semiconductor device according to claim 1, said semiconductor substrate includes another trench formed between said third region and said fourth region and formed to extend from the main surface of said semiconductor substrate through said second region and then reach said first region.

4. The semiconductor device according to claim 1, further comprising a fifth region of the first conductivity type formed at a lower part of said trench and having an impurity concentration higher than that of said first region.

* * * * *